United States Patent
Yu

(10) Patent No.: US 8,994,018 B2
(45) Date of Patent: Mar. 31, 2015

(54) OLED PACKAGING STRUCTURE AND PACKAGING METHOD

(71) Applicant: Shenzhen China Star Optoelectronics Technology Co., Ltd., Shenzhen, Guangdong (CN)

(72) Inventor: Wei Yu, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 37 days.

(21) Appl. No.: 14/117,030

(22) PCT Filed: Aug. 19, 2013

(86) PCT No.: PCT/CN2013/081783
§ 371 (c)(1),
(2) Date: Nov. 11, 2013

(87) PCT Pub. No.: WO2015/018107
PCT Pub. Date: Feb. 12, 2015

(65) Prior Publication Data
US 2015/0041767 A1  Feb. 12, 2015

(30) Foreign Application Priority Data
Aug. 7, 2013  (CN) .......................... 2013 1 0341067

(51) Int. Cl.
*H01L 29/08*  (2006.01)
*H01L 35/24*  (2006.01)
*H01L 51/00*  (2006.01)
*H01L 51/52*  (2006.01)
*H01L 51/56*  (2006.01)
*H01L 21/52*  (2006.01)

(52) U.S. Cl.
CPC .............. *H01L 51/524* (2013.01); *H01L 51/56* (2013.01); *H01L 21/52* (2013.01); *H01L 51/5246* (2013.01)

USPC .......................................................... 257/40

(58) Field of Classification Search
CPC ....... H01L 21/50; H01L 21/52; H01L 21/524; H01L 21/563; H01L 51/524; H01L 51/5246; H01L 51/56
See application file for complete search history.

(56) References Cited

U.S. PATENT DOCUMENTS

| 2003/0183332 A1* | 10/2003 | Simila .......................... 156/291 |
| 2004/0004294 A1* | 1/2004 | Hall et al. ...................... 257/783 |
| 2008/0248611 A1* | 10/2008 | Hanada et al. ................. 438/108 |

* cited by examiner

*Primary Examiner* — Colleen A Matthews
*Assistant Examiner* — Quovaunda V Jefferson
(74) *Attorney, Agent, or Firm* — Andrew C. Cheng

(57) ABSTRACT

The present invention provides an OLED packaging structure and a packaging method thereof. The OLED packaging structure comprises a packaging board and an OLED substrate. At least one seal frame matching OLED in size is formed through painting glass frit seal on the packaging board at a position corresponding to the OLED. An initial painting point is at every seal frame with a protruding prominence. A recess is set up on the OLED substrate corresponding the initial painting point to accommodate the prominence. the OLED packaging structure and the packaging method thereof is to set up a recess on an OLED substrate to accommodate a prominence on the initial painting point due to accumulation of glass frit seal on a packaging board, so that when adhering the OLED substrate to the packaging board the seal frame is adhesive to the OLED substrate tightly without significant gap. Therefore subsequent laser melding is more successful, to prevent from forming gaps between a packaging board, an OLED substrate and a seal frame, and lifetime of OLED is lengthened.

11 Claims, 4 Drawing Sheets

OLED PACKAGING STRUCTURE AND PACKAGING METHOD

CROSS REFERENCE TO RELATED APPLICATION

This application claims the benefit and priority of Chinese Application No. 201310341067.7, filed Aug. 7, 2013. The entire disclosures of each of the above applications are incorporated herein by reference.

BACKGROUND OF THE INVENTION

1. Field of the Invention

The present invention relates to an image display field, more particularly, to an OLED packaging structure and the packaging method thereof.

2. Description of the Prior Art

Organic Light-Emitting Diode display device is a new generation of display device. By manufacturing an organic film on a substrate in a way that an organic film locates between a cathode metal and an anode metal, the organic film illuminates when voltage is applied to the two electrodes. As the organic film is highly sensitive to moisture and oxygen, its illumination and lifetime will be greatly affected by its aging and degeneration caused by moisture and oxygen. Therefore packaging process to OLED apparatus is necessary.

Please refer to FIG. 1, the conventional packing method is that: a. painting glass frit seal on a position which corresponds to an OLED on a packaging board 1' to form a rectangle seal frame 3' whose size matches the OLED, and solidifying the glass frit seal in a curing oven; b. painting ultraviolet light curing adhesive 4' on the fringes around the packaging board 1'; c. adhering a packaging board 1' and an OLED substrate 2'; d. UV adhesive 4' is solidified under UV light (the effect of UV adhesive is to block moisture and to fix the packaging board 1' and the OLED substrate 2'); e. melting the glass frit seal on every rectangle seal frame 3' by using laser and adhering the packaging board 1' and the OLED substrate 2' by the congealed glass frit seal. A sealed cavity is formed through the packaging board 1', the OLED substrate 2' and the seal frame 3.

As FIG. 2 indicates, however, after the glass frit seal is painted, accumulation of adhesive appears on an initial painting point 30'. When the glass frit seal solidifies, a height of accumulation of adhesive at the initial painting point 30' is higher than that of other region, thereby forming a gap 12' between the glass frit seal nearby initial painting point 30' and the OLED substrate 2'. After the glass frit seal is hardened, even if using pressing mechanism to press the packaging board 1' and the OLED substrate 2', the gap would not disappear (please refer to FIG. 3). Therefore the region around initial painting point 30' cannot be successfully welded with OLED substrate 2' in the process of laser welding due to gap 12', which leaks moisture into the sealed cavity and affects the lifetime of OLED.

SUMMARY OF THE INVENTION

It is therefore a primary object of the present invention to provide a packaging structure and a packaging method thereof to prevent from forming gaps and lifetime of OLED.

According to the present invention, an organic light emitting diode (OLED) packaging structure comprises a packaging board, comprising a seal frame matching an OLED in size, the seal frame formed through painting glass frit seal on the packaging board at a position corresponding to the OLED and comprising a protruding prominence out of the seal frame at an initial painting point; and an OLED substrate, comprising a recess set up on a position aiming the initial painting point to accommodate the prominence.

Furthermore, the recess matches the prominence in size and shape.

Furthermore, cross-sectional views of the recess and the prominence are both trapezoid.

Furthermore, the recess and the OLED locate on the same side of the OLED substrate.

Furthermore, the recess is formed by acid etching.

According to the present invention, an organic light emitting diode (OLED) packaging structure comprises a packaging board, comprising a seal frame matching an OLED in size, the seal frame formed through painting glass frit seal on the packaging board at a position corresponding to the OLED and comprising a protruding prominence out of the seal frame at an initial painting point; and an OLED substrate, comprising a recess set up on a position aiming the initial painting point to accommodate the prominence. Cross-sectional views of the recess and the prominence are both trapezoid.

According to the present invention, an OLED packaging method comprises the steps of: Step S1, painting glass frit seal on a packaging board at a position corresponding to an OLED to form a seal frame matching the OLED in size, the seal frame comprising a protruding prominence out of the seal frame at the initial painting point; Step S2, setting up a recess at a position corresponding to the initial painting point on the OLED substrate to accommodate the prominence; Step S3, adhering the OLED substrate to the packaging board in pair in a way that the recess accommodates the prominence; and Step S4, welding the glass frit seal by using laser.

Furthermore, the recess matches the prominence in size and shape.

Furthermore, cross-sectional views of the recess and the prominence are both trapezoid.

Furthermore, the recess and the OLED locate on the same side of the OLED substrate.

Furthermore, the recess is formed by acid etching.

The OLED packaging structure and the packaging method thereof is to set up a recess on an OLED substrate to accommodate a prominence on the initial painting point due to accumulation of glass frit seal on a packaging board, so that when adhering the OLED substrate to the packaging board the seal frame is adhesive to the OLED substrate tightly without significant gap. Therefore subsequent laser melding is more successful, to prevent from forming gaps between a packaging board, an OLED substrate and a seal frame, and lifetime of OLED is lengthened.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

The present invention is described in detail in conjunction with the accompanying drawings and embodiments.

Figure 1:
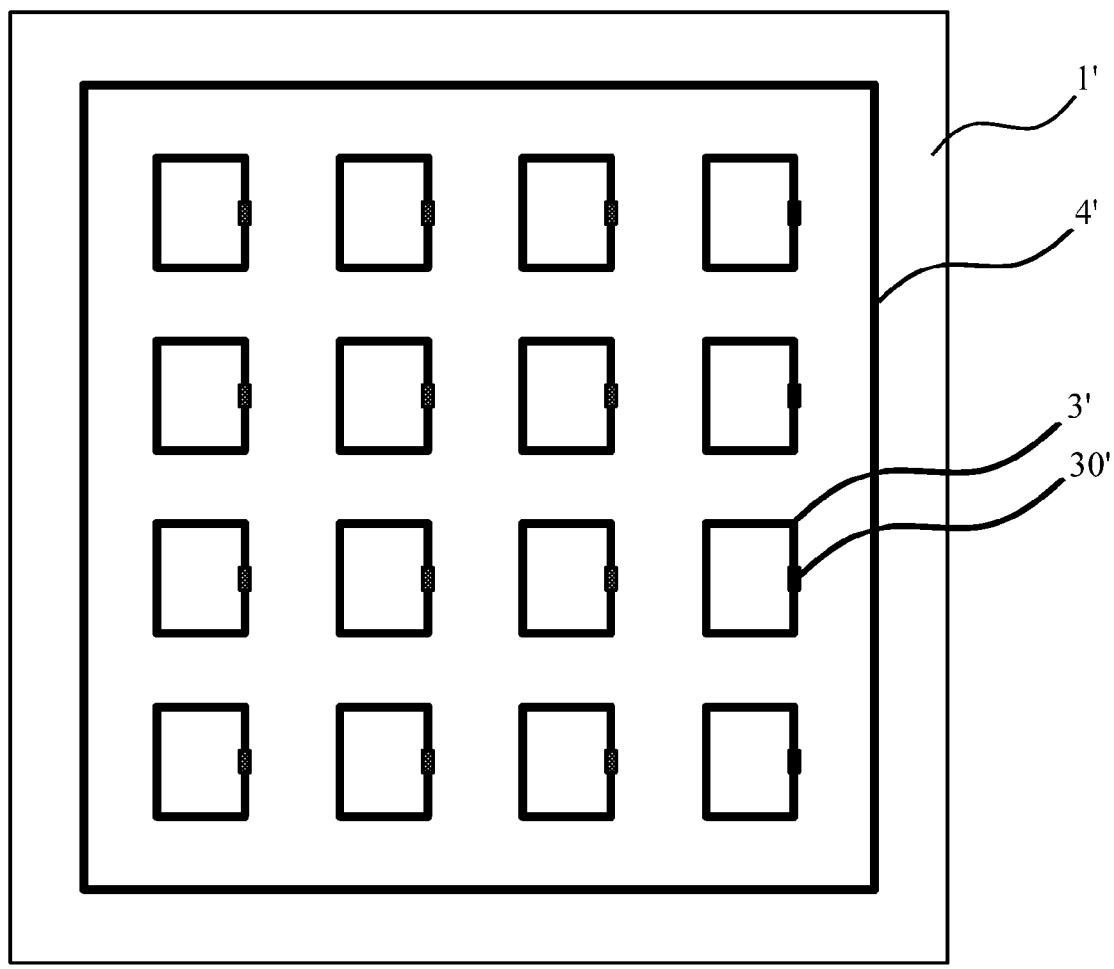
FIG. 1 is a top view of a conventional packaging board used in an OLED packaging structure.
Figure 2:
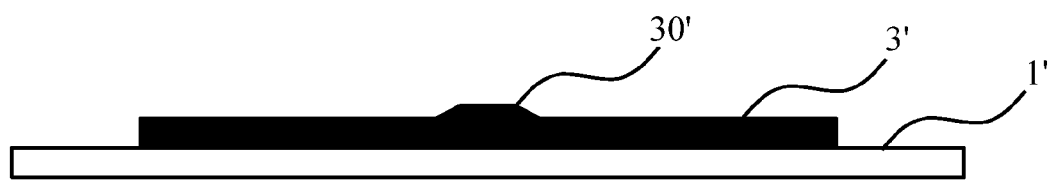
FIG. 2 is a side view of a conventional packaging board used in an OLED packaging structure.
Figure 3:
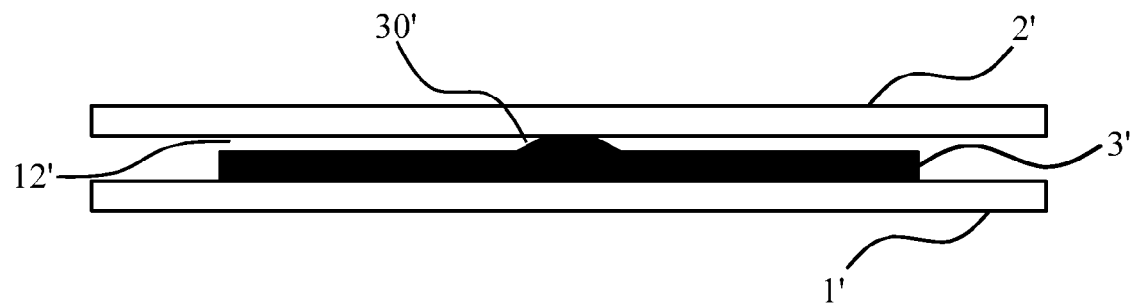
FIG. 3 is a side view of a conventional OLED packaging structure.
Figure 4:
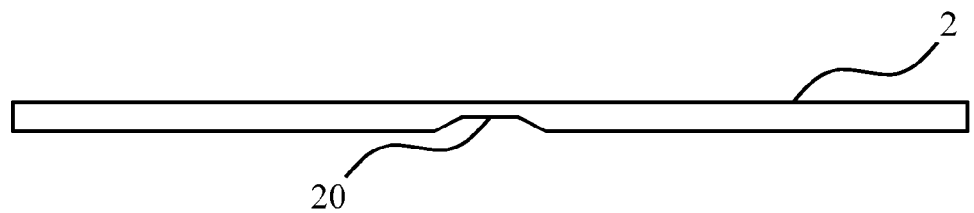
FIG. 4 is a side view of an OLED substrate for use in an OLED packaging structure according to a first embodiment of the present invention.
Figure 5:
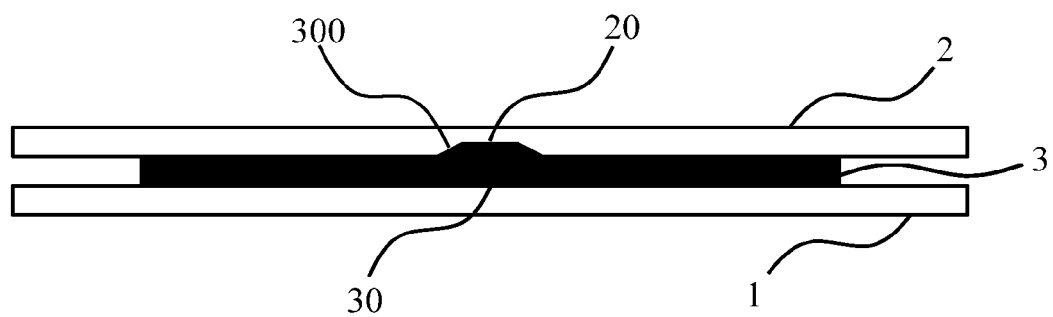
FIG. 5 is a side view of an OLED packaging structure according to a first embodiment of the present invention.
Figure 6:
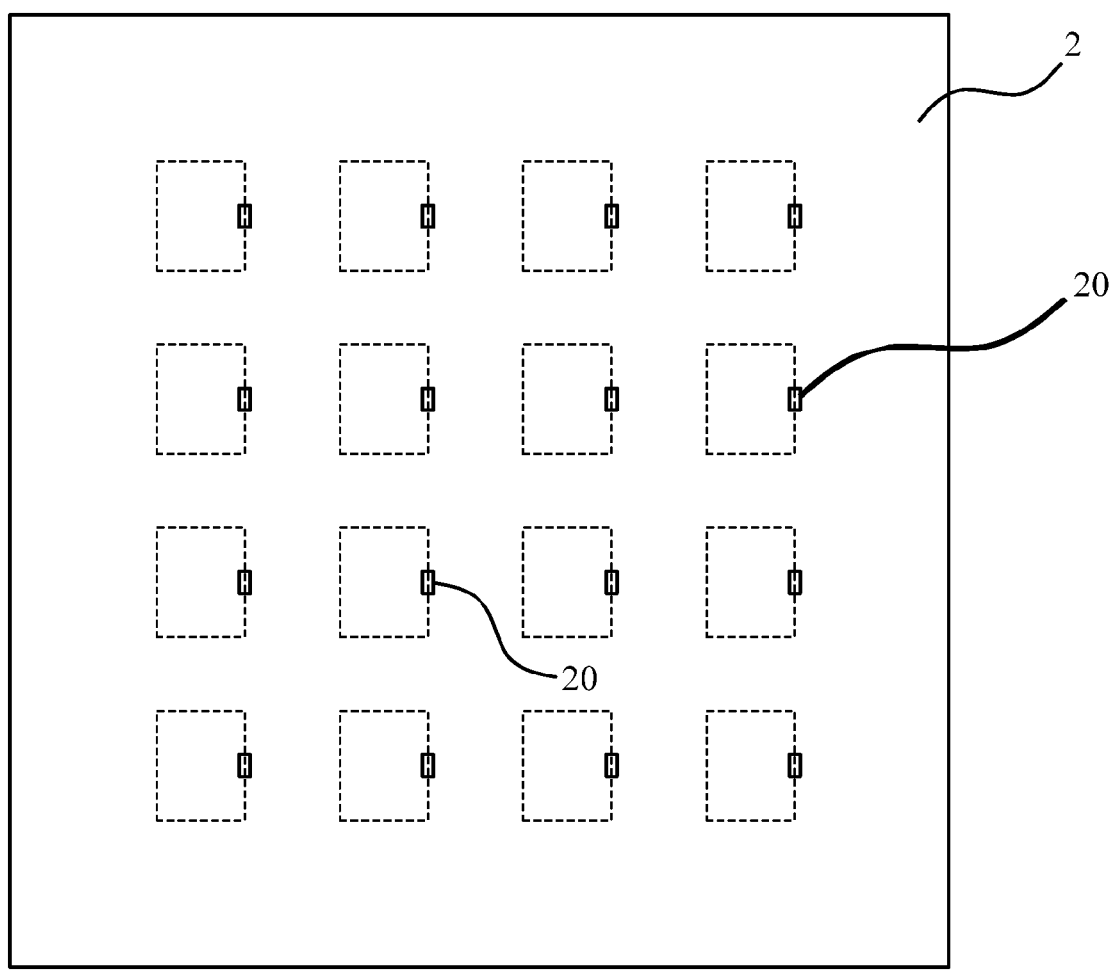
FIG. 6 is a top view of an OLED substrate for use in an OLED packaging structure according to a first embodiment of the present invention.

Please refer to FIG. 4 through FIG. 6, the packaging structure according to the first embodiment of the present invention comprises a packaging board 1 and an OLED substrate 2. At least a seal frame 3 is formed by painting glass frit seal on a position of the packaging board 3. A size of the seal frame 3 matches the OLED. An initial painting point 30 is on every seal frame 3. A prominence 300 on the initial painting point 30 protrudes the seal frame 3. A recess 20 is set up on the OLED substrate 2 corresponding to the initial painting point 30 to accommodate the prominence 300.

Since the prominence 300 on the initial painting point 30 protrudes from the seal frame 3 due to accumulation of glass frit seal on the packaging board 1, the present inventive embodiment improve the OLED substrate 2. Because the OLED substrate 2 is adhesive to the packaging board 1 in pair, the seal frame 3 on the packaging board 1 wards off the OLED on the OLED substrate 2 correspondingly to form a sealed cavity to keep out moisture. Due to the prominence 300, a gap appears nearby the initial painting point 30 between the OLED substrate 2 and the seal frame 3, and the sealability of the sealed cavity is thus reduced. The recess 20 is formed by etching (such as acid-etching) the OLED substrate 2 at a position corresponding to the initial painting point 30 whose size and shape match the prominence 300 (as FIG. 4 indicates). In the embodiment, cross-sectional view of the prominence 300 and the recess 20 are both trapezoid. In this way, when the OLED substrate 2 is adhered to the packaging board 1 in pair, the recess 20 can fit the prominence 300, and the seal frame 3 is adhesive tightly with the OLED substrate 2 without significant gap (as FIG. 5 indicates), so that subsequent laser melding is more successful, sealability of the sealed cavity is improved, and lifetime of OLED is lengthened.

Please refer to FIG. 6 again. As a plurality of OLEDs disperse on the OLED substrate 2, a plurality of seal frames 3 are formed on the packaging board 1 in correspondence. Likewise, a plurality of recesses 20 and the OLEDs are disposed on the same side of the OLED substrate 2. Dotted blocks in FIG. 6 indicates to the plurality of seal frames 3 on the packaging board 1, and the plurality of recesses 20 fit a plurality of prominences 300 on the packaging board 1 respectively.

Figure 7:
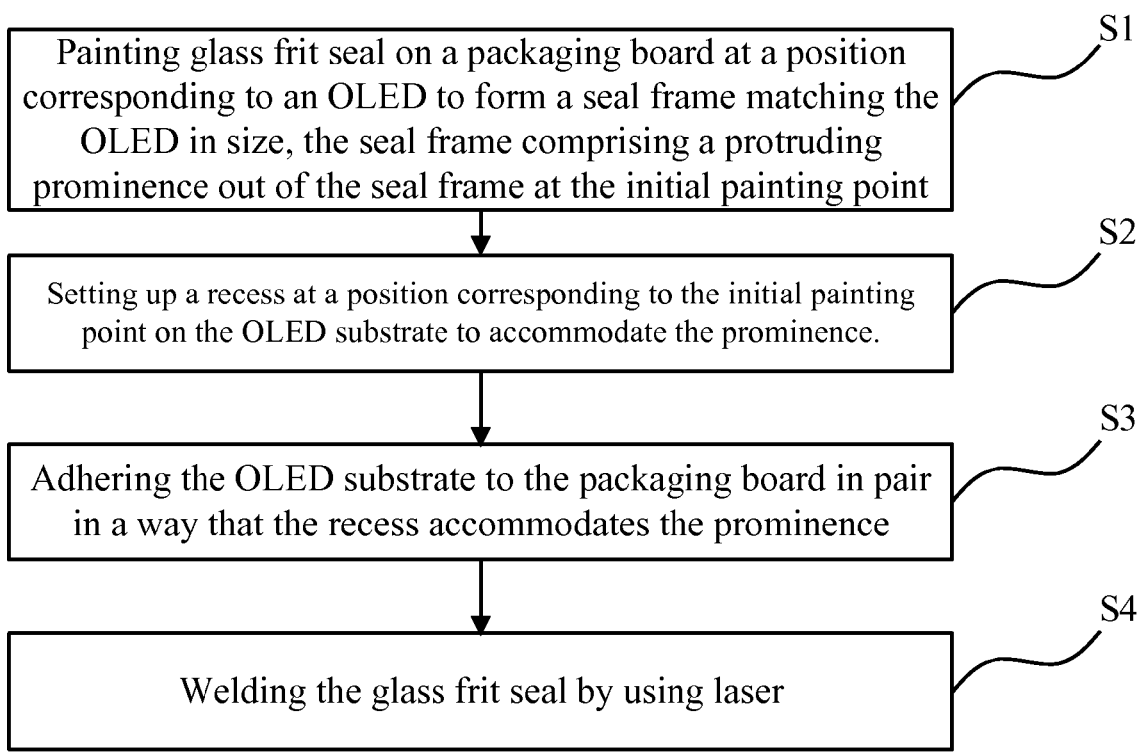
FIG. 7 is a flowchart of a method of packaging an OLED according to a second embodiment of the present invention.

Please refer to FIG. 7. According to the OLED packaging structure, an OLED packaging method provided in the second embodiment comprises:

Step S1, painting glass frit seal at a position corresponding to the OLED on the packaging board 1 to form at least a seal frame 3 matching the OLED in size and the seal frame 3 comprising a protruding prominence 300 out of the seal frame 3 at the initial painting point 30;

Step S2, setting up the recess 20 at a position corresponding to the initial painting point 30 on the OLED substrate 2 to accommodate the prominence 300;

In detail, the recess 20 is formed by acid etching and matches the prominence 300 in size and shape. Cross-sectional views of the recess 20 and the prominence 300 are both trapezoid, and the recess 20 and the OLEDs locate on the same side of the OLED substrate 2.

Step S3, adhering the OLED substrate 2 to the packaging board 1 in pair and accommodating the prominence 300 in the recess 20; and Step S4, welding the glass frit seal by using laser.

In sum, the OLED packaging structure and the packaging method thereof is to set up a recess on an OLED substrate to accommodate a prominence on the initial painting point due to accumulation of glass frit seal on a packaging board, so that when adhering the OLED substrate to the packaging board the seal frame is adhesive to the OLED substrate tightly without significant gap. Therefore subsequent laser melding is more successful, to prevent from forming gaps between a packaging board, an OLED substrate and a seal frame, and lifetime of OLED is lengthened.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An organic light emitting diode (OLED) packaging structure comprising:
    a packaging board, comprising a seal frame matching an OLED in size, the seal frame formed through painting glass frit seal on the packaging board at a position corresponding to the OLED and comprising a protruding prominence out of the seal frame at an initial painting point; and
    an OLED substrate, comprising a recess set up on a position aiming the initial painting point to accommodate the prominence.

2. The OLED packaging structure of claim 1, wherein the recess matches the prominence in size and shape.

3. The OLED packaging structure of claim 2, wherein cross-sectional views of the recess and the prominence are both trapezoid.

4. The OLED packaging structure of claim 1, wherein the recess and the OLED locate on the same side of the OLED substrate.

5. The OLED packaging structure of claim 1, wherein the recess is formed by acid etching.

6. An organic light emitting diode (OLED) packaging structure comprising:
    a packaging board, comprising a seal frame matching an OLED in size, the seal frame formed through painting glass frit seal on the packaging board at a position corresponding to the OLED and comprising a protruding prominence out of the seal frame at an initial painting point; and
    an OLED substrate, comprising a recess set up on a position aiming the initial painting point to accommodate the prominence,
    wherein cross-sectional views of the recess and the prominence are both trapezoid.

7. An OLED packaging method, comprising:
    Step S1, painting glass frit seal on a packaging board at a position corresponding to an OLED to form a seal frame matching the OLED in size, the seal frame comprising a protruding prominence out of the seal frame at the initial painting point;
    Step S2, setting up a recess at a position corresponding to the initial painting point on the OLED substrate to accommodate the prominence;

Step S3, adhering the OLED substrate to the packaging board in pair in a way that the recess accommodates the prominence; and Step S4, welding the glass frit seal by using laser.

8. The OLED packaging method of claim 7, wherein the recess matches the prominence in size and shape.

9. The OLED packaging method of claim 8, wherein cross-sectional views of the recess and the prominence are both trapezoid.

10. The OLED packaging method of claim 7, wherein the recess and the OLED locate on the same side of the OLED substrate.

11. The OLED packaging method of claim 7, wherein the recess is formed by acid etching.

\* \* \* \* \*